(12) United States Patent
Spick et al.

(10) Patent No.: US 11,414,902 B2
(45) Date of Patent: Aug. 16, 2022

(54) DEVICE AND METHOD FOR DETECTING INTENTION TO LOCK OR UNLOCK A MOTOR VEHICLE OPENING ELEMENT

(71) Applicant: VITESCO TECHNOLOGIES GMBH, Hanover (DE)

(72) Inventors: Gabriel Spick, Toulouse (FR); Olivier Elie, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 0 days.

(21) Appl. No.: 17/271,928

(22) PCT Filed: Aug. 20, 2019

(86) PCT No.: PCT/EP2019/072231
§ 371 (c)(1),
(2) Date: Feb. 26, 2021

(87) PCT Pub. No.: WO2020/048764
PCT Pub. Date: Mar. 12, 2020

(65) Prior Publication Data
US 2021/0317689 A1    Oct. 14, 2021

(30) Foreign Application Priority Data
Sep. 3, 2018 (FR) ..................... 1857897

(51) Int. Cl.
*G01R 35/00* (2006.01)
*E05B 81/76* (2014.01)
(Continued)

(52) U.S. Cl.
CPC .............. *E05B 81/77* (2013.01); *B60R 25/01* (2013.01); *B60R 25/20* (2013.01); *G01R 27/02* (2013.01);
(Continued)

(58) Field of Classification Search
CPC ......... E05B 81/77; E05B 81/76; B60R 25/01; B60R 25/20; G01R 35/005; G01R 27/28;
(Continued)

(56) References Cited

U.S. PATENT DOCUMENTS

| 9,995,778 B1 | 6/2018 | Fiori |
| 2007/0001663 A1 | 1/2007 | Hrubes |

(Continued)

FOREIGN PATENT DOCUMENTS

FR    3 044 037    5/2017

OTHER PUBLICATIONS

International Search Report for PCT/EP2019/072231 dated Oct. 28, 2019, 5 pages.
(Continued)

Primary Examiner — Raul J Rios Russo
(74) Attorney, Agent, or Firm — Nixon & Vanderhye

(57) ABSTRACT

A device for detecting a user's intention to lock or unlock a motor vehicle opening element, this device being integrated into a handle, including: an inductive sensor that includes an LC resonant circuit consisting at least of a coil and a main capacitor; a handle target; a microcontroller equipped with a unit for measuring the resonant frequency of the LC resonant circuit; an adjustment device for adjusting the value of the total capacitance of the LC resonant circuit, this adjustment device providing at least two different total capacitance values for the LC resonant circuit.

20 Claims, 2 Drawing Sheets

(51) Int. Cl.
*B60R 25/01* (2013.01)
*B60R 25/20* (2013.01)
*H03K 17/95* (2006.01)
*G01R 27/28* (2006.01)
*G01R 27/32* (2006.01)
*G01R 27/02* (2006.01)
*G01R 27/26* (2006.01)
*H03K 17/97* (2006.01)

(52) U.S. Cl.
CPC ......... *G01R 27/2605* (2013.01); *G01R 27/28* (2013.01); *G01R 27/32* (2013.01); *G01R 35/00* (2013.01); *G01R 35/005* (2013.01); *H03K 17/9537* (2013.01); *H03K 2017/9706* (2013.01); *H03K 2217/9401* (2013.01)

(58) Field of Classification Search
CPC ........ G01R 27/32; G01R 35/00; G01R 27/02; G01R 27/2605; H03K 17/9537; H03K 2017/9706; H03K 2217/9401; H03K 2217/952; H03K 17/97
USPC ................... 324/76.11–76.83, 459, 600, 601
See application file for complete search history.

(56) References Cited

U.S. PATENT DOCUMENTS

| | | | |
|---|---|---|---|
| 2019/0368238 A1* | 12/2019 | Spick | G07C 9/00174 |
| 2020/0047712 A1* | 2/2020 | Spick | H03K 17/97 |
| 2021/0246694 A1* | 8/2021 | Spick | E05B 81/77 |

OTHER PUBLICATIONS

Written Opinion of the ISA for PCT/EP2019/072231 dated Oct. 28, 2019, 7 pages.

* cited by examiner

DEVICE AND METHOD FOR DETECTING INTENTION TO LOCK OR UNLOCK A MOTOR VEHICLE OPENING ELEMENT

CROSS-REFERENCE TO RELATED APPLICATIONS

This application is the U.S. national phase of International Application No. PCT/EP2019/072231 filed Aug. 20, 2019 which designated the U.S. and claims priority to FR 1857897 filed Sep. 3, 2018, the entire contents of each of which are hereby incorporated by reference.

BACKGROUND OF THE INVENTION

Field of the Invention

The invention pertains to the field of motor vehicles and vehicles in general, and relates to a device and to a method for detecting a user's intention to lock or unlock a motor vehicle opening element, this device being integrated into a handle of the opening element.

Description of the Related Art

Handles of vehicle opening elements, such as door handles, may be fitted with a device for detecting intention to lock or unlock in order to transmit, to the units for controlling the locks of the vehicle, information for commanding the opening or closure of the vehicle. These detection devices are required for implementing various locking systems commonly used in vehicles, such as "hands-free" systems, systems with deployable handles, or even electrically assisted systems.

"Hands-free" systems detect the presence of a remote-control access "hands-free" electronic fob, carried by the user, close to the vehicle. The detection of this fob at the same time as the detection of intention to lock or unlock respectively triggers locking or unlocking of the opening elements of the vehicle.

Systems with deployable handles use handles that are flush with the surface of the vehicle body, so as to be fully integrated in line with the vehicle. The detection of intention to lock or unlock in this case triggers a mechanism that activates the handle by deploying it so that the handle protrudes from the vehicle body and is then able to be grasped by the user.

Electrically assisted systems use vehicle opening elements whose opening or closing movement is motorized. The detection of intention to lock or unlock in this case triggers not only locking or unlocking of the opening element, but also a closing or opening movement of the opening element in question.

The systems listed above by way of example require a device for detecting intention to lock or unlock that is reliable, accurate, and which avoids false detections.

Patent application FR3044037 describes a device for detecting intention to lock or unlock, which comprises, inter alia, an inductive sensor in order to improve detection reliability. This detection device comprises:
- an inductive sensor that comprises an LC resonant circuit consisting of a coil and one or two capacitors;
- a handle target located facing the coil, this target being able to move from a rest position to a displaced position, under the effect of the user pressing on the handle, the distance between the coil and the handle target being modified between the rest position and the displaced position;
- a microcontroller equipped with means for measuring the resonant frequency of the LC resonant circuit.

SUMMARY OF THE INVENTION

The invention aims to improve devices for detecting intention to lock or unlock having an inductive sensor from the prior art by proposing a device of this type whose detection reliability is further improved.

To this end, the invention targets a device for detecting a user's intention to lock or unlock a motor vehicle opening element, this device being integrated into a handle, comprising:
- an inductive sensor that comprises an LC resonant circuit consisting at least of a coil and a main capacitor;
- a handle target located facing the coil, this target being able to move from a rest position to a displaced position, under the effect of the user pressing on the handle, the distance between the coil and the handle target being modified between the rest position and the displaced position;
- a microcontroller equipped with means for measuring the resonant frequency of the LC resonant circuit.

This device furthermore comprises an adjustment device for adjusting the value of the total capacitance of the LC resonant circuit, this adjustment device providing at least two different total capacitance values for the LC resonant circuit.

Such a device makes it possible to modulate the capacitance value of the LC resonant circuit in order to adapt it to external physical constraints that in particular modify the position of the handle target. These physical constraints are for example mechanical construction tolerances and dispersions that cause uncertainty as to the exact position of the handle target with respect to the coil. Another example of a physical constraint is the temperature, which causes the parts forming the handle to expand, and which may thus change the distance between the handle target and the coil, just as it may change the value of the electronic components.

The modulation of the value of the capacitance of the LC circuit leads to the resonant frequency of this circuit being modified, thereby allowing the microcontroller to operate at an optimum resonant frequency.

Another subject of the invention targets a method for calibrating a detection device as described above, a step of actuating the adjustment device in order to modify the total capacitance of the LC resonant circuit.

Such a calibration method makes it possible to adapt the capacitance value of the LC circuit so that the resonant frequency of the LC circuit is optimum with regard in particular to the microcontroller that is used and the real physical constraints that apply at the time of the calibration.

According to one preferred feature, the method comprises the following steps:
- measuring the resonant frequency for each total capacitance value of the LC resonant circuit provided by the adjustment device;
- identifying the measured resonant frequency values that are in the saturation region of the microcontroller, these resonant frequency values being substantially equal and corresponding to the saturation frequency of the microcontroller;
- identifying the first measured resonant frequency value that is outside the saturation region of the microcontroller, and identifying the corresponding optimum configuration of the adjustment device;

applying said optimum configuration to the adjustment device so that the LC resonant circuit has a resonant frequency corresponding to said first measured resonant frequency value that is outside the saturation region of the microcontroller.

This method makes it possible to place the resonant frequency of the LC circuit precisely at an optimum value that is the maximum value of the resonant frequency before saturation of the microcontroller that is used.

Maximum sensitivity of the device for detecting intention to lock or unlock is thus achieved. This maximum sensitivity makes it possible to finely adjust the detection thresholds of the device, which thus exhibits improved detection reliability.

The detection device may comprise the following additional characteristics, on their own or in combination:

the adjustment device comprises at least one adjustment capacitor as well as linking means, located in the microcontroller, for linking the adjustment capacitor to the main capacitor, these linking means being able to move between a neutral position in which the adjustment capacitor is disconnected, the LC resonant circuit thus having a first total capacitance value, and an adjustment position in which the adjustment capacitor is placed in a circuit with the main capacitor, the LC resonant circuit thus having a second total capacitance value; the placing in a circuit may for example consist in placing the adjustment capacitor in series or in parallel with the main capacitor;

the adjustment device comprises between three and five adjustment capacitors and the corresponding linking means;

the microcontroller comprises a frequency measurement input for measuring the resonant frequency of the LC resonant circuit;

the linking means comprise a switch designed to disconnect the corresponding adjustment capacitor or to connect this adjustment capacitor from or to ground; the adjustment capacitor may be disconnected and connected to ground by disconnecting or connecting a single terminal of the capacitor from or to ground, the other terminal remaining permanently connected to the LC resonant circuit;

the LC resonant circuit comprises two main capacitors connected firstly to the LC resonant circuit and connected secondly to ground.

The method for calibrating the detection device may comprise the following additional features, on their own or in combination:

it comprises a step of storing the saturation frequency of the microcontroller;

the calibration method is implemented when the resonant frequency of the LC resonant circuit is a value less than a predetermined value away from the saturation frequency of the microcontroller;

in the step of identifying the first measured resonant frequency value that is outside the saturation region of the microcontroller, this first frequency value is identified with a predetermined safety margin;

the method is implemented when the detection device is switched on, whether this is only when it is switched on for the first time or each time it is switched on;

the method is implemented when the temperature varies beyond a predetermined limit since the last implementation of the method;

the method is implemented periodically, with a predetermined period.

BRIEF DESCRIPTION OF THE DRAWINGS

A preferred exemplary embodiment of the invention will now be described with reference to the appended drawings, in which.

DESCRIPTION OF THE PREFERRED EMBODIMENTS

Figure 1:
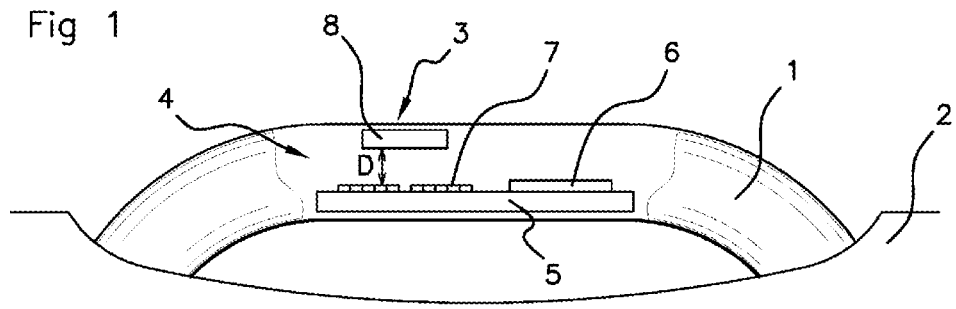
FIG. 1 schematically shows a handle of an opening element of a vehicle, which handle comprises a detection device according to the invention.

FIG. 1 schematically shows a motor vehicle handle 1 equipped with a detection device 4 according to the invention. This handle 1 may for example be the handle of a door or of the trunk of the vehicle, or of any other opening element of the vehicle. This handle 1 is attached to the body 2 of the vehicle.

The handle 1 comprises a pressing region 3 on which the user presses to signify their intention to lock or unlock the opening element.

A device 4 for detecting intention to lock or unlock is mounted inside the handle 1. The detection device 4 comprises a printed circuit board 5 on which a microcontroller 6 and a coil 7 are mounted. These elements located in the handle 1 are shown schematically in cross section. The coil 7 is formed for example by a copper track wound in a spiral on the printed circuit board 5, extending in the plane of the printed circuit board 5. The printed circuit board 5 also comprises the connections and the cables necessary to connect it to the rest of the vehicle (not shown), in particular its voltage supply and the wiring necessary for the detection device 4 to transmit the information relating to the user's intention to lock or unlock.

A handle target 8 is additionally mounted in the handle 1 just below the surface of the pressing region 3. The target 8 may be mounted using any known mechanical means; it may for example be inserted into a recess provided within the handle 1 or, according to another example, the handle 1 may be molded around the target 8. The target 8 is preferably a parallelepiped or a disk of non-magnetic conductive metal. The target 8 and the printed circuit board 5 are mounted in the handle 1 such that the target 8 is arranged facing the coil 7, at a distance D. In FIG. 1, the target 8 is in the rest position, in the absence of any action on the handle 1.

When the user exerts pressure, for example with their thumb, on the pressing region 3, the handle 1 deforms elastically in the area of the pressing region 3, thereby causing a slight displacement of the target 8 in the direction of the coil 7, the target 8 thus moving into what is called a "displaced position". The pressure on the pressing region 3 therefore causes a variation in the distance D, between the rest position and the displaced position, and it is this distance variation that will be detected by the device 4. The described detection device 4 is caused to detect intention to lock or unlock when a variation in the distance D of the order of 0.1 millimeter is detected.

Figure 2:
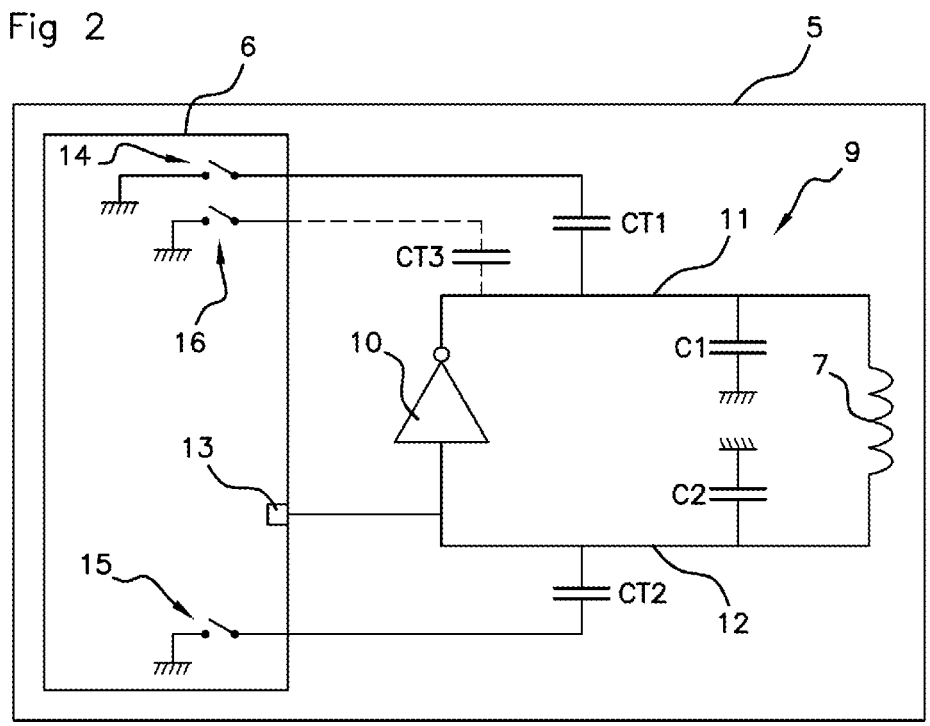
FIG. 2 is a circuit diagram of part of the detection device from FIG. 1.

FIG. 2 is a circuit diagram showing elements mounted on the printed circuit board 5 of the detection device 4 from FIG. 1.

The device 4 is a detection device having an inductive sensor. The microcontroller 6 is thus connected to an LC resonant circuit 9, in a known manner. This LC resonant circuit 9 conventionally consists of the coil 7, two main capacitors C1 and C2 and an inverting gate 10 (NOT logic gate), making it possible to create and to maintain the resonance of the LC circuit 9. The main capacitor C1 is connected between ground and a first branch 11 of the LC circuit 9, this first branch 11 extending between the coil 7 and the inverting gate 10. The main capacitor C2 is connected between a second branch 12 of the LC circuit 9 and ground, this second branch 12 also extending between the coil 7 and the inverting gate 10.

The microcontroller comprises a frequency measurement input 13 connected to the LC circuit 9, making it possible to measure the oscillating frequency of the LC circuit 9. The microcontroller 6 comprises an oscillator (not shown), as is conventional. The microcontroller may also have the function of disconnecting (or not disconnecting) the supply of power to the inverting gate, thereby making it possible to stop the oscillations of the LC circuit between two oscillating frequency measurements in order to reduce consumption.

In principle, in a known manner, the microcontroller 6 counts the number of oscillations per unit of time that occur at the frequency measurement input 13, and thus determines the resonant frequency of the LC circuit 9. Measuring the resonant frequency of the LC circuit 9 makes it possible to detect variations in this frequency that are caused by a movement of the target 8 in relation to the coil 7. The LC resonant circuit 9 forms an inductive sensor.

The detection device 4 additionally comprises an adjustment device for adjusting the value of the capacitance of the LC circuit 9. This adjustment device, in the present example, comprises two adjustment capacitors CT1 and CT2 as well as respective linking means 14, 15 for linking the adjustment capacitors CT1, CT2 to the main capacitors C1, C2. The adjustment capacitor CT1 is connected firstly to the first branch 11 and secondly to the corresponding linking means 14. The adjustment capacitor CT2 is connected firstly to the second branch 12 and secondly to the corresponding linking means 15.

The linking means 14, 15 are located in the microcontroller 6 and, in accordance with what is shown schematically in FIG. 2, these linking means 14, 15 are able to disconnect each of the adjustment capacitors CT1, CT2 from or to connect each of them to ground. In the present example, the linking means 14, 15 are able to disconnect a terminal of each of the adjustment capacitors CT1, CT2 from or to connect this terminal to ground. The linking means 14, 15 are able to move between a neutral position in which the corresponding adjustment capacitor is disconnected and an adjustment position in which the corresponding adjustment capacitor is grounded, this adjustment capacitor then being placed in a circuit (here: in parallel) with the corresponding main capacitor.

The capacitor CT3 shown in dotted lines relates to a variant that will be described later on.

When the linking means 14, 15 disconnect the adjustment capacitors CT1, CT2 from the circuit, the detection device 4 behaves in the same way as a detection device having an inductive sensor from the prior art. The LC circuit 9 will then oscillate at a resonant frequency $F_R$ that is specific thereto and that has the value:

$$F_R = \frac{1}{2\pi \sqrt{LC_{total}}}$$

where:
L=value of the inductance of the coil 7; and
$C_{total}$=value of the total capacitance of the LC circuit 9.

In the example of FIG. 2, the adjustment capacitors CT1, CT2 are outside the circuit. One of their terminals is still connected to the circuit 9, but since their other terminal is disconnected, they have no effect. The total capacitance $C_{total}$ of the LC circuit 9 therefore has the value:

$$C_{total} = \frac{C1 \times C2}{C1 + C2}$$

To simplify the description, C1 and C2 denote both the main capacitors and the value of their capacitance.

The resonant frequency $F_R$ of the LC circuit 9, which therefore depends in particular on the value of the capacitance $C_{total}$, may be modified by modifying this value of $C_{total}$. The role of the adjustment device is to modify this value $C_{total}$ in order to influence the value of the resonant frequency of the LC circuit 9.

From the configuration shown in FIG. 2, if the linking means 14, 15 are controlled so as to connect the two adjustment capacitors CT1, CT2 to ground, these adjustment capacitors CT1, CT2 then form part of the LC circuit 9. The value of $C_{total}$ will then be as follows:

$$C_{total} = \frac{(C1 + CT1) \times (C2 + CT2)}{C1 + CT1 + C2 + CT2}$$

In the present example in which there are 2 adjustment capacitors CT1, CT2, four different values may be obtained for the resonant frequency of the LC circuit 9, depending on the configuration of the linking means 14, 15. The four possible configurations, corresponding to four values of $C_{total}$, are therefore as follows:

the linking means 14 and 15 disconnect the adjustment capacitors CT1 and CT2 from ground:

$$C_{total}1 = \frac{(C1 + 0) \times (C2 + 0)}{C1 + 0 + C2 + 0} = \frac{C1 \times C2}{C1 + C2}$$

the linking means 14 connect the capacitor CT1 to ground while the linking means 15 disconnect the capacitor CT2:

$$C_{total}2 = \frac{(C1 + CT1) \times (C2 + 0)}{C1 + CT1 + C2 + 0}$$

the linking means 14 disconnect the capacitor CT1 while the linking means 15 connect the capacitor CT2 to ground:

$$C_{total}3 = \frac{(C1+0) \times (C2+CT2)}{C1+0+C2+CT2}$$

the linking means 14 and 15 connect the adjustment capacitors CT1 and CT2 to ground:

$$C_{total}4 = \frac{(C1+CT1) \times (C2+CT2)}{C1+CT1+C2+CT2}$$

For each of these four possible values of $C_{total}$, there is a corresponding different resonant frequency value $F_R$ specific to the LC circuit 9.

The resonant frequency of the LC circuit may thus be chosen to best suit the mechanical mounting conditions in the handle 1, taking into account the capacitances of the microcontroller 6 that is used.

Specifically, the various mechanical mounting tolerances within the handle 1 generate side chains and therefore uncertainty as to the precise position of the handle target 8 in relation to the coil 7. Since the detection device 4 is designed to detect minute movements of the target 8 in relation to the coil 7, these side chains, caused by mechanical tolerances as well as mechanical clearances in general and in particular those caused by ageing, have a negative impact on detection accuracy. Likewise, the ageing of the handle 1 or the expansion or retraction thereof under the effect of temperature also generates uncertainty as to the relative position of the target 8 and of the coil 7. The initial distance D (see FIG. 1) is therefore subject to these unknowns.

The detection device 4 makes it possible to choose the most appropriate resonant frequency of the LC circuit 9 from among the various possible resonance frequencies allowed by the set of linking means 14, 15 and adjustment capacitors CT1, CT2.

According to one preferred feature, the most appropriate resonant frequency for the LC circuit 9 is chosen so as to be just below the saturation limit specific to the microcontroller 6 that is used, for a given mechanical configuration.

Figure 3:
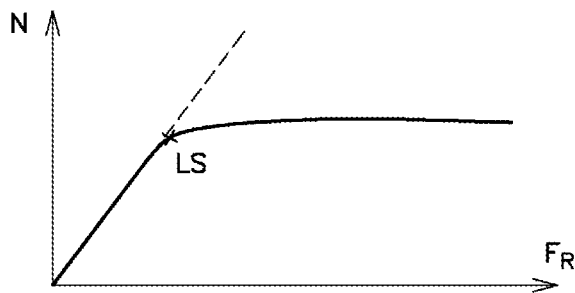
FIG. 3 is a graph showing the evolution of the measurement of the number of oscillations measured by the microcontroller, during a fixed time, as a function of the actual resonant frequency of the LC circuit.

Specifically, with reference to FIG. 3, there is a limit saturation value LS beyond which it is no longer beneficial to increase the resonant frequency of the LC circuit 9. The curve in FIG. 3 shows the variation in the number N of oscillations that the microcontroller 6 is capable of measuring via its input 13, as a function of the actual resonant frequency of the LC circuit 9. N depends on the clock frequency of the microcontroller. The curve 3 illustrates Shannon's theorem, which theorizes the limit that is reached (called saturation) when it comes to sampling a signal with a given clock frequency, the sampling being greatly degraded beyond a certain frequency of the sampled signal. However, before the saturation limit LS, N increases linearly with the resonant frequency $F_R$. Therefore, before the saturation limit LS, the greater the resonant frequency of the LC circuit 9, the greater the value of N, this meaning that the sensitivity of the detection device 4 is greater. However, if the resonant frequency $F_R$ increases beyond the saturation limit LS, N barely increases any more, and the sensitivity gain is lost. The optimum choice for the resonant frequency $F_R$ of the LC circuit 9 is therefore that of the available resonant frequency $F_R$ (from among the various possibilities for $F_R$, four of them in the example described above) that is immediately lower than the frequency corresponding to the value LS.

The value of LS depends on the microcontroller 6 that is used, but also on the relative mechanical positioning of the target 8 with respect to the coil 7. This value of LS is therefore specific to each mechanical configuration, and changes with the ageing of the handle, temperature conditions, etc.

One example of a method for calibrating the detection device 4, making it possible to choose the optimum resonant frequency $F_R$ for the LC circuit 9, will now be described.

This calibration method may be implemented whenever it is deemed appropriate to redefine an optimum resonant frequency $F_R$ for the LC circuit 9, for example:

when the detection device 4 is switched on for the first time, and possibly each time the detection device 4 is switched on;

if the value of the resonant frequency of the LC circuit 9 measured by the input 13 approaches the saturation frequency of the microcontroller within more than a predetermined limit (see example described below);

if the temperature varies beyond a predetermined limit since the last calibration;

in general, after any modification of the hardware configuration of the handle;

periodically, with a predetermined period.

Figure 4:
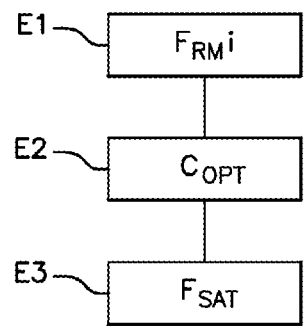
FIG. 4 is a diagram illustrating the calibration method according to the invention.

With reference to the algorithm of FIG. 4, the first step E1 of the calibration method consists in performing an effective measurement $F_{RM}i$, via the input 13, of the resonant frequency of the LC circuit 9, specifically for each possible configuration (four of them in the example described above) corresponding to a value $C_{total}$ of the capacitance of the LC circuit 9. According to this example, four values $F_{RM}1$, $F_{RM}2$, $F_{RM}3$, $F_{RM}4$ are obtained. These values do not correspond to the actual resonant frequency that occurs in the LC circuit 9, but rather correspond to this resonant frequency as measured by the microcontroller 6, that is to say taking into account the limitations of this microcontroller 6 due to the saturation phenomenon described above.

Figure 5:
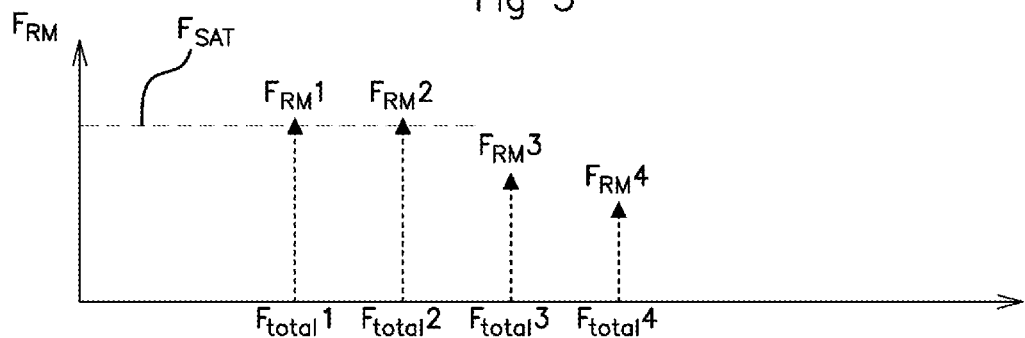
FIGS. 5 and 6 are graphs illustrating the frequencies measured by the microcontroller during the calibration method, respectively for two implementation variants of the method.

FIG. 5 illustrates one example of the four values $F_{RM}i$ obtained in step E1, according to the example in which four configurations are possible for the capacitors of the LC circuit 9. According to the method, an effective measurement $F_{RM}2$, $F_{RM}3$ and $F_{RM}4$ of the resonant frequency of the LC circuit 9 is performed for the four actual resonance frequencies $F_{total}1$, $F_{total}2$, $F_{total}3$, $F_{total}4$ possible for the LC circuit 9, corresponding to the four different capacitance values $C_{total}1$, $C_{total}2$, $C_{total}3$, $C_{total}4$. In this example, the frequencies $F_{total}1$, $F_{total}2$, $F_{total}3$, $F_{total}4$ are shown in descending order.

The first two values $F_{RM}1$ and $F_{RM}2$ are substantially equal, but the actual resonant frequency of the LC circuit 9 corresponding to these two configurations is necessarily different, since they correspond to two different values of $C_{total}$. The fact that these two measurements $F_{RM}1$ and $F_{RM}2$ are substantially equal indicates that these measurements are in the saturation region of the microcontroller 6.

Starting from the frequency $F_{total}2$, the measured resonant frequency $F_{RM}$ begins to decrease, thereby indicating that the measured resonant frequency values $F_{RM}3$ and $F_{RM}4$ are outside the saturation region.

In step E2 of the algorithm of FIG. 4, the optimum value $C_{OPT}$ for the value of the capacitance of the LC circuit 9 is chosen from among the configurations $C_{total}1$, $C_{total}2$, $C_{total}3$, $C_{total}4$. In the present example, the optimum configuration is $C_{total}3$, which corresponds to the frequency measurement $F_{RM}3$ that is the first to be outside the saturation region. This is therefore the possible value for the capacitance $C_{total}$ which corresponds to a resonant frequency of the LC circuit 9 just below the saturation region.

In step E3, the value of the saturation frequency $F_{SAT}$ is recorded. When several frequency measurements $F_{RM}i$ return substantially the same frequency value, then this is the saturation frequency $F_{SAT}$ (here the values of $F_{RM}1$ and $F_{RM}2$). The value of the saturation frequency $F_{SAT}$ may for example be used so that the calibration method is implemented again when the resonant frequency of the LC resonant circuit is a value less than a predetermined value away from the frequency $F_{SAT}$. In other words, when the resonant frequency of the LC circuit gets too close to the saturation frequency $F_{SAT}$ (due to physical modifications in the handle), the calibration method is executed again.

The calibration is then ended and the detection device 4 will then be used with the optimum configuration for the value of the capacitance $C_{OPT}$ of the LC circuit 9, that is to say with the corresponding arrangement of the linking means 14, 15 for implementing the configuration $C_{total}3$.

Figure 6:
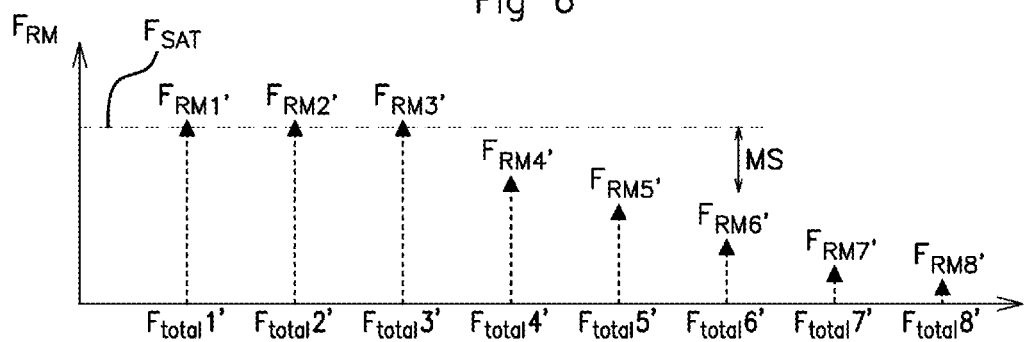

FIG. 6 illustrates another exemplary embodiment of the detection device 4 and of the associated detection method.

According to this variant, the detection device 4 this time has eight possible adjustment capacitor combinations, corresponding to eight possibilities for the value of the total capacitance $C_{total}$ of the LC circuit 9. This configuration corresponds for example to the addition of an additional adjustment capacitor CT3 shown in dotted lines in FIG. 2. This adjustment capacitor CT3 is linked to corresponding linking means 16. The eight possibilities for the value of the capacitance $C_{total}$ correspond to the four possibilities described above plus the following possibilities:

just the adjustment capacitor CT3 is placed in a circuit with the main capacitors C1, C2;
the adjustment capacitor CT3 and the adjustment capacitor CT1 are placed in a circuit with the main capacitors C1, C2;
the adjustment capacitor CT3 and the adjustment capacitor CT2 are placed in a circuit with the main capacitors C1, C2;
the three adjustment capacitors CT1, CT2, CT3 are placed in a circuit with the main capacitors C1, C2.

The application of the calibration method to such a detection device 4 having eight frequency possibilities $F_{RM}1'$ to $F_{RM}8'$ is illustrated in the graph of FIG. 6, similar to the graph of FIG. 5 (the same numbering is used, followed by an apostrophe). As before, the change from the saturation region (measurements $F_{RM}1'$ to $F_{RM}3'$) to a region outside saturation (measurements $F_{RM}4'$ to $F_{RM}8'$) is clearly visible on the graph between the measurements measurement $F_{RM}3'$ to $F_{RM}4'$.

FIG. 6 illustrates an optional additional feature of the calibration method in which, in step E2 of the method, a safety margin MS is taken into account in the choice of the optimum configuration $C_{OPT}$. According to FIG. 6, the optimum configuration that is chosen is not the one that corresponds to the measurement $F_{RM}4'$ that immediately follows the exit from the saturation region, but rather is the one that corresponds to the measurement $F_{RM}5'$ that follows the exit from the saturation region minus this predetermined safety margin. In the example of FIG. 6, the optimum configuration that is chosen corresponds to $F_{total}5'$.

By way of example, in the configuration described above, the coil 7 has an inductance of 1 µH, the value of the resulting capacitance of the two main capacitors C1, C2 corresponds to 300 pF and the three adjustment capacitors CT1, CT2, CT3 have the values 10 pF, 20 pF and 30 pF, respectively. The microcontroller 6 has a clock frequency of 32 MHz, thereby leading to possible resonant frequencies of the order of 5 to 10 MHz for the LC circuit. The safety margin MS is for example 50 kHz when the saturation region is located at 8 MHz.

Other variant embodiments of the detection device 4 and of the associated calibration method may be implemented without departing from the scope of the invention. For example, the detection device 4 may comprise any number of adjustment capacitors allowing a desired number of combinations for the capacitance value of the LC circuit 9. In principle, an excessively high number of combinations is not necessary and requires significant computing capacities to be mobilized in order to implement the calibration method. Three adjustment capacitors allowing eight possible resonant frequencies for the LC circuit 9 prove to be a good choice for the number of adjustment capacitors. According to one preferred feature, the LC circuit 9 comprises three to five adjustment capacitors.

The detection device may also be coupled to other sensors, such as capacitive sensors.

The device may be used in any type of vehicle opening element handle, in particular deployable handles.

The invention claimed is:

1. A method for calibrating a device (4) for detecting a user's intention to lock or unlock a motor vehicle opening element, this device (4) being integrated into a handle (1), comprising:
    an inductive sensor that comprises an LC resonant circuit (9) consisting at least of a coil (7) and a main capacitor (C1, C2);
    a handle target (8) located facing the coil (7), this target (8) being able to move from a rest position to a displaced position, under the effect of the user pressing on the handle (1), the distance (D) between the coil (7) and the handle target (8) being modified between the rest position and the displaced position;
    a microcontroller (6) equipped with means (13) for measuring the resonant frequency (FRM) of the LC resonant circuit (9);
    an adjustment device for adjusting the value of the total capacitance (Ctotai) of1 the LC resonant circuit (9), this adjustment device providing at least two different total capacitance values for the LC resonant circuit (9),
    said method comprising the following steps:
    measuring the resonant frequency ($F_{RM}i$) for each total capacitance value ($C_{total}$) of the LC resonant circuit (9) provided by the adjustment device;
    identifying the measured resonant frequency values ($F_{RM}i$) that are in the saturation region of the microcontroller (6), these resonant frequency values being substantially equal and corresponding to the saturation frequency ($F_{SAT}$) of the microcontroller (6);
    identifying the first measured resonant frequency value that is outside the saturation region of the microcontroller (6), and identifying the corresponding optimum configuration ($C_{OPT}$) of the adjustment device;
    applying said optimum configuration ($C_{OPT}$) to the adjustment device so that the LC resonant circuit (9) has a resonant frequency ($F_{RM}$) corresponding to said first measured resonant frequency value that is outside the saturation region of the microcontroller (6).

2. The calibration method as claimed in claim 1, further comprising a step of storing the saturation frequency ($F_{SAT}$) of the microcontroller (6).

3. The method as claimed in claim 2, wherein the calibration method is implemented when the resonant frequency ($F_{RM}$) of the LC resonant circuit (9) is a value less than a predetermined value away from the saturation frequency ($F_{SAT}$) of the microcontroller (6).

4. The method as claimed in claim 1, wherein, in the step of identifying the first measured resonant frequency value that is outside the saturation region of the microcontroller (6), this first frequency value is identified with a predetermined safety margin (MS).

5. The method as claimed in claim 1, wherein the method is implemented when the detection device (4) is switched on.

6. The method as claimed in claim 1, wherein the method is implemented when the temperature varies beyond a predetermined limit since the last implementation of the method.

7. The method as claimed in claim 1, wherein the method is implemented periodically, with a predetermined period.

8. The method as claimed in claim 2, wherein, in the step of identifying the first measured resonant frequency value that is outside the saturation region of the microcontroller (6), this first frequency value is identified with a predetermined safety margin (MS).

9. The method as claimed in claim 3, wherein, in the step of identifying the first measured resonant frequency value that is outside the saturation region of the microcontroller (6), this first frequency value is identified with a predetermined safety margin (MS).

10. The method as claimed in claim 2, wherein the method is implemented when the detection device (4) is switched on.

11. The method as claimed in claim 3, wherein the method is implemented when the detection device (4) is switched on.

12. The method as claimed in claim 4, wherein the method is implemented when the detection device (4) is switched on.

13. The method as claimed in claim 2, wherein the method is implemented when the temperature varies beyond a predetermined limit since the last implementation of the method.

14. The method as claimed in claim 3, wherein the method is implemented when the temperature varies beyond a predetermined limit since the last implementation of the method.

15. The method as claimed in claim 4, wherein the method is implemented when the temperature varies beyond a predetermined limit since the last implementation of the method.

16. The method as claimed in claim 5, wherein the method is implemented when the temperature varies beyond a predetermined limit since the last implementation of the method.

17. The method as claimed in claim 2, wherein the method is implemented periodically, with a predetermined period.

18. The method as claimed in claim 3, wherein the method is implemented periodically, with a predetermined period.

19. The method as claimed in claim 4, wherein the method is implemented periodically, with a predetermined period.

20. The method as claimed in claim 5, wherein the method is implemented periodically, with a predetermined period.

* * * * *